(12) United States Patent
Jeunink et al.

(10) Patent No.: US 7,626,684 B2
(45) Date of Patent: Dec. 1, 2009

(54) LITHOGRAPHIC PROJECTION APPARATUS AND A DEVICE MANUFACTURING METHOD USING SUCH LITHOGRAPHIC PROJECTION APPARATUS

(75) Inventors: Andre Bernardus Jeunink, Bergeyk (NL); M'hamed Akhssay, Helmond (NL); Johannes Jacobus Matheus Baselmans, Oirschot (NL); Franciscus Antonius Chrysogonus Marie Commissaris, Waalre (NL); Simon De Groot, Eindhoven (NL); Wim Tjibbo Tel, Helmond (NL); Alexander Hendrikus Martinus Van der Hoff, Valkenswaard (NL); Arnout Van de Stadt, Eindhoven (NL); Remco Marcel Van Dijk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/213,150

(22) Filed: Jun. 16, 2008

(65) Prior Publication Data

US 2008/0252870 A1 Oct. 16, 2008

Related U.S. Application Data

(62) Division of application No. 10/886,051, filed on Jul. 8, 2004, now Pat. No. 7,403,264.

(51) Int. Cl.
*G03B 27/32* (2006.01)
*G03B 27/42* (2006.01)
*G03B 27/68* (2006.01)

(52) U.S. Cl. .............................. 355/77; 355/53; 355/52

(58) Field of Classification Search .................. 355/52, 355/53, 55, 67, 77; 250/548; 430/30, 311
See application file for complete search history.

(56) References Cited

U.S. PATENT DOCUMENTS

| 4,540,277 A | 9/1985 | Mayer et al. |
| 4,801,977 A | 1/1989 | Ishizaka et al. |
| 4,920,505 A | 4/1990 | Suzuki |

(Continued)

FOREIGN PATENT DOCUMENTS

EP 1 164 436 A2 12/2001

(Continued)

OTHER PUBLICATIONS

European Search Report issued for European Patent Application No. 05105767.7-2222, dated Jan. 3, 2006.

*Primary Examiner*—Hung Henry Nguyen
(74) *Attorney, Agent, or Firm*—Pillsbury Winthrop Shaw Pittman LLP

(57) ABSTRACT

A lithographic projection apparatus is disclosed that includes a predictive system configured to predict changes in projection system aberrations with time with respect to measured aberration values, a modelling system configured to determine an application-specific effect of said predicted projection system aberration changes on at least one parameter of an image for a selected pattern, a control system configured to generate a control signal specific to the selected pattern according to said predicted projection system aberration changes and their application-specific effect on the at least one parameter of the image, and an image adjusting system, responsive to the control signal, to compensate for the application-specific effect of said predicted projection system aberration changes on the image.

23 Claims, 6 Drawing Sheets

U.S. PATENT DOCUMENTS

| | | |
|---|---|---|
| 5,674,650 A | 10/1997 | Dirksen et al. |
| 5,739,899 A * | 4/1998 | Nishi et al. ............... 355/53 |
| 5,801,815 A * | 9/1998 | Takahashi ............... 355/53 |
| 5,953,106 A | 9/1999 | Unno et al. |
| 6,014,455 A * | 1/2000 | Sumiyoshi et al. .......... 382/144 |
| 6,115,108 A | 9/2000 | Capodieci |
| 6,388,823 B1 | 5/2002 | Gaber et al. |
| 6,563,564 B2 | 5/2003 | de Mol et al. |
| 6,646,729 B2 | 11/2003 | Van der Laan et al. |
| 6,809,797 B2 | 10/2004 | Baselmans et al. |
| 2002/0001088 A1 | 1/2002 | Wegmann et al. |

FOREIGN PATENT DOCUMENTS

| | | |
|---|---|---|
| EP | 1 355 140 A1 | 10/2003 |
| EP | 1 164 436 A3 | 1/2005 |

\* cited by examiner

LITHOGRAPHIC PROJECTION APPARATUS AND A DEVICE MANUFACTURING METHOD USING SUCH LITHOGRAPHIC PROJECTION APPARATUS

This is a divisional application of U.S. patent application Ser. No. 10/886,051, filed Jul. 8, 2004 which is now U.S. Pat. No. 7,403,264 the entire contents of which is hereby incorporated by reference.

FIELD OF THE INVENTION

This invention relates to lithographic projection apparatus and a device manufacturing method using such lithographic projection apparatus.

BACKGROUND OF THE INVENTION

The invention finds application, for example, in the field of lithographic projection apparatus incorporating a radiation system for supplying a projection beam of radiation, a support structure for supporting a patterning device, which serves to pattern the projection beam according to a desired pattern, a substrate table for holding a substrate; and a projection system for projecting the patterned beam onto a target portion of the substrate.

The term "patterning device" as employed here should be broadly interpreted as referring to devices and structures that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing one or more piezoelectric actuators. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic circuitry. In both of the situations described here above, the patterning device can comprise one or more programmable mirror arrays. More information on mirror arrays as here referred to can be gleaned, for example, from U.S. Pat. Nos. 5,296,891 and 5,523,193, and from WO 98/38597 and WO 98/33096, which are incorporated herein by reference. In the case of a programmable mirror array, the support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For simplicity, parts of the rest of this specification are directed specifically to examples involving a mask and mask table; however, the general principles discussed in such instances should be seen in the broader context of the patterning device as set forth above.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information on such lithographic devices is disclosed in U.S. Pat. No. 6,046,792, the contents of which are incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This combination of processing steps is used as a basis for patterning of a single layer of the device which is for example an integrated circuit (IC). Such a patterned layer may then undergo various processes, such as etching, ion-implantation (doping), metallization, oxidation, chemical-mechanical polishing, etc., all of which are intended to finish off an individual layer. If several layers are required, then the whole procedure, or a variant thereof, will have to be repeated for each new layer. Eventually, an array of devices will be produced on the substrate (wafer). These devices are then separated from one another by a technique such as dicing or sawing, so that the individual devices can be mounted on a carrier, connected to pins, etc. Further information regarding such processing can be obtained, for example, from "Microchip Fabrication: A Practical Guide to Semiconductor Processing", Third Edition, by Peter van Zant, McGraw Hill Publishing Co., 1997, ISBN 0-07-067250-4, incorporated herein by reference.

For simplicity, the projection system may hereinafter be referred to as the "lens". However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Furthermore, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus is described, for example, in U.S. Pat. No. 5,969,441 and WO 98/40791, the contents of both of which are incorporated herein by reference.

Although specific reference may be made in this specification to the use of the apparatus according to the invention in the manufacture of integrated circuits, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The person skilled in the art will appreciate that, in the context of such alternative applications, any use of the terms "wafer" or "die" in this text should be considered as being replaced by the more general terms "substrate" and "target portion", respectively. Generally, throughout the specification, any use of the term "mask" should be considered as encompassing within its scope the use of the term "reticle"

In the present document, the terms "radiation" and "projection beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm).

The phenomenon of lens heating can occur in the projection system of a lithographic projection apparatus. The projection lens becomes slightly heated by the projection beam radiation during exposures. As a result of this heating, refractive index changes occur, and a certain expansion of lens elements occurs, causing subtle changes in the geometric form of those elements, with an attendant change in their optical properties. This can result in the occurrence of new lens aberrations, or a change in existing aberrations. Because the occurrence of these aberration changes depends on such matters as the particular lens geometry, lens material, projection wavelength, light source power, target portion, wafer-reflectivity, size, and so on, the accuracy with which the effects of such lens heating can be predicted can be limited, especially in the absence of any measurement and compensating mechanism.

Lens heating has always occurred to some extent in lithographic projection apparatus. However, with the trend to integrating an ever-increasing number of electronic components, and thus smaller features, in an IC, and to increase the manufacturing throughput, shorter wavelength radiation, such as EUV radiation has been used, as well as high-power radiation sources, such as 3-6 kW Mercury-arc lamps and excimer lasers with a power of 10 to 20 W, which together with the reduction in feature size have made lens heating a more serious problem. The problem is generally worse in scanners than in steppers because, in a stepper, substantially the whole (circular) cross-section of each lens element is irradiated, whereas, in a scanner, generally only a slit-shaped portion of the lens elements is irradiated; consequently, the effect in a scanner is far more differential than in a stepper, even if the lens aberrations in the scan direction are averaged out in the scanner, thereby resulting in the occurrence of new lens aberrations.

The change in the optical properties of the elements of the projection system due to such lens heating naturally affects the image that is projected, principally by causing a change in the image parameters, of which magnification is particularly important for the XY-plane, and focus is particularly important for the Z-plane. However this lens heating effect can be calibrated and compensated for very well, e.g. by adjusting the positions of the lens elements to effect a compensating change in magnification or other image parameters of the projection system, for example as disclosed in EP 1164436A or U.S. Pat. No. 6,563,564, the contents of both of which are incorporated herein by reference. The lens heating effects depend on the lens properties, which are calibrated when the apparatus is constructed and may be recalibrated periodically thereafter, and various parameters of the exposures carried out, such as mask transmission, dose, illumination settings, field size and substrate reflectivity.

When performing imaging in a lithographic projection apparatus, despite the great care with which the projection system is designed and the very high accuracy with which the system is manufactured and controlled during operation, the image can still be subject to aberrations, which can cause offsets in the image parameters for example, distortion (i.e. a non-uniform image displacement in the target portion at the image plane: the XY-plane), lateral image shift (i.e. a uniform image displacement in the target portion at the image plane), image rotation, and focal plane deformation (i.e. a non-uniform image displacement in the Z-direction, for instance, field curvature). It should be noted that, in general, image parameter offsets are not necessarily uniform, and can vary as a function of position in the image field. Distortion and focal plane deformation can lead to overlay and focus errors, for example overlay errors between different mask structures, and line-width errors. As the size of features to be imaged decreases, these errors can become intolerable.

Consequently, it is desirable to provide compensation (such as adjustment of the projection system and/or substrate) to correct for, or at least attempt to minimize, these errors. This presents the problems of first measuring the errors and then calculating appropriate compensation. Previously, alignment systems were used to measure the displacements in the image field of alignment marks. However, alignment marks typically consist of relatively large features (of the order of a few microns), causing them to be very sensitive to specific aberrations of the projection system. The alignment marks are unrepresentative of the actual features being imaged, and because the imaging errors depend inter alia on feature size, the displacements measured and compensations calculated did not necessarily optimize the image for the desired features.

Another problem occurs when, for instance, because of residual manufacturing errors, the projection system features an asymmetric variation of aberration over the field. These variations may be such that at the edge of the field the aberration becomes intolerable.

A further problem occurs when using phase-shift masks (PSM's). Conventionally, the phase shift in such masks has to be precisely 180 degrees. The control of the phase is critical; deviation from 180 degrees is detrimental. PSM's, which are expensive to make, must be carefully inspected, and any masks with substantial deviation in phase shift from 180 degrees will generally be rejected. This leads to increased mask prices.

A further problem occurs with the increasing requirements imposed on the control of critical dimension (CD). The critical dimension is the smallest width of a line or the smallest space between two lines permitted in the fabrication of a device. In particular the control of the uniformity of CD, the so-called CD uniformity, is of importance. In lithography, efforts to achieve better line width control and CD uniformity have recently led to the definition and study of particular error types occurring in features, as obtained upon exposure and processing. For instance, such image error types are an asymmetric distribution of CD over a target portion, an asymmetry of CD with respect to defocus (which results in a tilt of Bossung curves), asymmetries of CD within a feature comprising a plurality of bars (commonly referred to as Left-Right asymmetry), asymmetries of CD within a feature comprising either two or five bars (commonly known as L1-L2 and L1-L5, respectively), differences of CD between patterns that are substantially directed along two mutually orthogonal directions (for instance the so-called H-V lithographic error), and for instance a variation of CD within a feature, along a bar, commonly known as C-D. Just as the aberrations mentioned above, these errors are generally non-uniform over the field. For simplicity we will hereafter refer to any of these error types, including the errors such as, for example, distortion, lateral image shift, image rotation, and focal plane deformation, as lithographic errors, i.e. feature-deficiencies of relevance for the lithographer.

Lithographic errors are caused by specific properties of the lithographic projection apparatus. For instance, the aberration of the projection system, or imperfections of the patterning devices and imperfections of patterns generated by the patterning devices, or imperfections of the projection beam may cause lithographic errors. However, also nominal properties (i.e. properties as designed) of the lithographic projection apparatus may cause unwanted lithographic errors. For instance, residual lens aberrations which are part of the nominal design may cause lithographic errors. For reference hereafter, we will refer to any such properties that may cause lithographic errors as "properties".

As mentioned above, the image of a pattern can be subject to aberrations of the projection system. A resulting variation of CD (for example, within a target portion) can be measured and subsequently be mapped to an effective aberration condition of the projection system which could produce said measured CD variation. A compensation can then be provided to the lithographic projection system such as to improve CD uniformity. Such a CD-control method is described in U.S. Pat. No. 6,115,108, incorporated herein by reference, and comprises imaging a plurality of test patterns at each field point of a plurality of field points, a subsequent processing of the exposed substrate, and a subsequent CD measurement for each of the imaged and processed test patterns. Consequently, the method is time consuming and not suitable for in-situ CD control. With increasing demands on throughput (i.e. the number of substrates that can be processed in a unit of time) as well as CD uniformity, the control, compensation and balancing of lithographic errors must be improved, and hence, there is the problem of furthering appropriate control of properties.

U.S. Pat. No. 6,563,564 (P-0190) discloses a lens heating model by which projection system aberrations due to the lens heating effect can be corrected for by way of image parameter offset control signals that serve to adjust the image parameters of the projection system to compensate for the calculated change in the aberration effect due to such lens heating. In this case the change in the aberration effect with time is determined on the basis of a stored set of predetermined parameters corresponding to the selected aberration effect; these parameters can be obtained by a calibration step. The image parameter offsets may comprise focus drift, field curvature, magnification drift, third-order distortion, and combinations thereof. However, the required ideal compensation will depend on the particular application (the particular pattern, illumination mode, etc.), and the number of parameters that can be adjusted is generally not high enough to cancel out every aberration completely, so that the determination of the compensation to apply in a particular case will always be a compromise, the particular compromise to be chosen depending on the required application. Because the conventional lens heating model does not take into account the particular application, it follows that the calculated compensation will not be optimal for every particular application.

EP 1251402A1 (P-0244) discloses an arrangement for compensating for projection system aberrations on the basis of the relationship between properties of the substrate, the layer of radiation sensitive material on the substrate, projection beam, the patterning device and the projection system, and the lithographic errors causing anomalies in the projected image. A control system determines a merit function which weighs and sums the lithographic errors, and calculates a compensation to apply to at least one of the substrate, the projection beam, the patterning device and the projection system to optimize the merit function. Although the use of such a merit function enables compensation to be applied in such a manner as to reach a reasonable compromise in terms of optimization of the image, it is found that, since such optimization is intended to provide the best compromise in terms of imaging quality over the whole of the image, the image quality in parts of the image or in particular applications may be relatively low.

A control system may be provided for compensating for the effect of changes in a property of lithographic projection apparatus with time, such as the change in magnification of the projection system due to lens heating, in which a control signal is generated according to a predicted change in the property with time, a comparator compares a value based on the predicted change to a threshold, and generates a trigger signal when the value is greater than the threshold value, and the alignment system performs an alignment in response to the trigger signal. Such an arrangement triggers a so-called "realignment" when the predictive correction becomes larger than the desired maximum. This system therefore predicts the heating effects that will occur in performing a series of exposures and applies appropriate corrections in advance of the exposures being made when the corresponding threshold value is exceeded. This technique ensures that realignments occur only when errors are out of certain ranges, and avoids unnecessary realignments, thus avoiding loss of throughput in the exposure process. In certain applications errors in the predictive correction may result in unnecessary additional alignment steps and loss of throughput, since the optimal time for realignment is not calculated on the basis of the particular application. This could mean in practice that the imaging performance is worse than expected in a particular series of exposures, due to the realignment being triggered too late for the particular application; or the throughput is less than expected, due to the realignment being effected sooner than required in the series of exposures.

SUMMARY OF THE INVENTION

It is an object of the present invention to effect adjustments to the projection system of lithographic projection apparatus to compensate for the effect of lens aberrations in such a manner as to provide optimal image quality for a particular application, that is for a particular combination of mask (for example the product pattern) and illumination mode.

According to the present invention there is provided lithographic projection apparatus including a radiation system for providing a beam of radiation, a support structure for supporting a patterning device for imparting a pattern to the projection beam, a substrate table for holding a substrate, a projection system for projecting the patterned beam onto a target portion of the substrate so as to produce an image of the patterning device on the target portion, a predictive system for predicting changes in projection system aberrations with time with respect to measured aberration values, a modeling system for determining the application-specific effect of said predicted projection system aberration changes on certain parameters of the image of a selected patterning device to be used in the apparatus for producing a specific required patterned beam, a control system for generating a control signal specific to the required patterned beam according to said predicted projection system aberration changes and their application-specific effect on certain parameters of the image, and an adjustment system for carrying out imaging adjustments in dependence on the control signal to compensate for the application-specific effect of said predicted projection system aberration changes on the image of the selected patterning device.

In this specification the term "application" is used to denote the combination of the patterning device (the mask) and the illumination mode. In this regard the patterning device may be a conventional mask or reticle or a phase shift mask (PSM) and may be characterized by the feature size, the orientation, the density, etc. of the pattern to be produced on the product by the patterning device), and the illumination mode may be characterized by the numerical aperture (NA), the sigma inner/outer, the diffractive optical elements (DOE's), etc.

This enables the aberrations to be compensated for, with precedence being given to those aberrations that are of most significance to the particular application (the particular pattern, illumination mode, etc.) in preference to aberrations that are of lesser significance in relation to that particular application. The appropriate adjustments to compensate for the aberrations that are appropriate to the particular application can then be determined and applied in such a manner to cancel out the effect of the aberrations optimally for the given application. For example, when the product pattern or part of the product pattern to be lithographically exposed has only horizontal lines as the features that require to be accurately defined by the lithographic exposure, such an arrangement will ensure that the effect of the aberrations of the projection system will be cancelled out optimally only for such horizontal lines and not for vertical lines. The fact that, in this example, the effect of the aberrations so far as hypothetical vertical lines are concerned is not compensated for optimally is immaterial since no such vertical lines require to be defined accurately in the product or the relevant part of the product.

The adjustment system can be constituted by any suitable compensation scheme for compensating for the effect of the aberration changes. Methods of compensating for aberrations suitable for use with lithographic projection apparatus are, for instance, adjustments to fine position (an X-, Y-, and Z-translation, and a rotation about the X-, Y-, and Z-axis) of the holder for holding the patterning device, similar fine positioning of the substrate table, movements or deformation of optical elements (in particular, fine positioning using an X-, Y-, and Z-translation/rotation of optical elements of the projection system), and, for instance, methods and devices that change the energy of the radiation impinging on the target portion. However, suitable compensations are not limited to such examples; for instance, methods of changing the wavelength of the radiation beam, changes to the imaged pattern, changing the index of refraction of gas-filled spaces traversed by the projection beam, and changing the spatial distribution of the intensity of the radiation beam may also serve to effect the required compensation.

The adjustment system may be adapted to adjust at least a selected one of: the position of the support structure along the optical axis of the projection system, the rotational orientation of the support structure, the position of the substrate table along said optical axis, the rotational orientation of the substrate table, the position along said optical axis of one or more movable lens elements comprised in said projection system, the degree of decentering with respect to said optical axis of one or more movable lens elements comprised in said projection system, the central wavelength of the projection beam, or saddle-like deformation of one or more lens elements comprised in said projection system using edge actuators.

In one implementation of the invention the predictive system is arranged to determine the predicted projection system aberration changes with time on the basis of a lens heating model that predicts changes in at least one aberration value with time as a result of lens heating or cooling. Using an appropriate lens heating model it is possible for appropriate aberration offsets to be predicted in advance so that these aberration offsets can be used to determine the offsets in image parameters which can be used to calculate and thus apply appropriate (optimized with respect to a defined merit function) adjustments for the given application.

In another implementation of the invention the modeling system is arranged to determine the application-specific effect of said projection system aberration changes on the basis of data indicative of the selected patterning device and the illumination mode of the projection system.

The control system may use information on the aberrations of the projection system to adapt the settings of the projection system in such a way that certain distortions of the image are counteracted optimally. Both low-order aberrations, which cause image distortion effects that are independent of the optical path in the lens system to form the image, and high-order lens aberrations, which relate to distortion effects that depend on the optical path actually used in the lens system, can be corrected by such an arrangement.

The control system may be arranged to generate a control signal which preferentially compensates predicted changes in features of the image in one direction in the plane of the image as compared with predicted changes in features of the image in another direction in the plane of the image, in accordance with the known sensitivities of the selected patterning device to projection system aberrations in the two directions.

Furthermore the control system may be arranged to generate a control signal which preferentially compensates predicted changes in features of the image in the direction normal to the plane of the image, in accordance with the known sensitivities of the selected patterning device to projection system aberrations in said direction. The control signal can be generated in accordance with a defined merit function determining the relative weightings to be given to the effects of projection system aberrations on different parameters of the image, and in a particular embodiment, in accordance with a user-defined specification.

The control system may be arranged to generate a control signal on the basis of known correspondence between changes in imaging adjustments of the adjustment system and the aberration changes being compensated for by such imaging adjustments. Additionally the control system may be arranged to generate a trigger signal to trigger measurement by a measurement system and adjustment by the adjustment system in response to such measurement when the predicted change in the image parameters with time is greater than a threshold value.

One embodiment of the invention further includes overlay metrology feedback device for correcting for a shift in a metrology overlay target for a current layer measured with respect to the metrology overlay target for a previous layer, as a result of said predicted projection system aberration changes and the imaging adjustments effected to compensate for the application-specific effect of said predicted projection system aberration changes with respect to measured aberration values on certain parameters of the image, on the basis of an optimization procedure providing for the changes in the aberrations to which the image is most sensitive to be compensated for according to a defined merit-function.

Another embodiment of the invention further includes a wafer alignment system for compensating for the effect of a shift in a respective wafer alignment mark provided for the alignment of each layer of successive layers of images to be applied to the target portion, as a result of said predicted projection system aberration changes and the imaging adjustments effected to compensate for the application-specific effect of said predicted projection system aberration changes with respect to measured aberration values on certain parameters of the image, on the basis of an optimization procedure providing for the changes in the aberrations to which the image is most sensitive to be compensated for according to a defined merit-function.

Another embodiment of the invention further includes a mask alignment system for compensating for the effect of a shift in an image of a mask alignment mark provided for the alignment of the patterning device relative to the target portion, as a result of said predicted projection system aberration changes and the imaging adjustments effected to compensate for the application-specific effect of said predicted projection system aberration changes with respect to measured aberration values on certain parameters of the image, on the basis of an optimization procedure providing for the changes in the aberrations to which the image is most sensitive to be compensated for according to a defined merit-function.

In one embodiment, the control system incorporates a realignment controller for re-measuring at least one aberration value when the predicted effect on one or more image parameters with time is greater than a corresponding (e.g. user-defined) threshold value. The use of thresholds for the lithographic parameters means that appropriate realignments are made only when these thresholds are exceeded, so that the effect on throughput is minimized whilst still keeping good imaging performance.

In a development of the invention, the adjustment system is arranged to carry out imaging adjustments over successive scan positions during scanning exposure of the substrate to allow for variations in the scanned image over the extent of the substrate in order to optimize the image as a function of scan position. This enables the optimal projection system adjustments to be varied as a function of the scan position (e.g. the Y-position of the scanner) during an exposure scan so as to enable the image quality to be optimized over the whole of the scan to compensate for variations in the image structure (for example horizontal lines in a first part of the product scanned and vertical lines in a subsequent part of the product scanned) in the scan direction.

The invention further provides a device manufacturing method using lithographic projection apparatus, the method including providing a substrate having a target portion for receiving an image, selecting a patterning device in accordance with a required patterning application, using a projection system to project a selected beam of radiation onto the patterning device to produce a specific required patterned beam providing an image of the patterning device on the target portion, predicting changes in projection system aberrations with time with respect to measured aberration values, determining the application-specific effect of said predicted projection system aberration changes on certain parameters of the image of the selected patterning device to be used in the apparatus for producing the specific required patterned beam, generating a control signal specific to the required patterned beam according to said predicted projection system aberration changes and their application-specific effect on certain parameters of the image, and carrying out imaging adjustments in dependence on the control signal to compensate for the application-specific effect of said predicted changes in the aberrations on the image of the selected patterning device.

Another aspect of an embodiment of the invention provides a data carrier incorporating a computer program for controlling a device manufacturing method using lithographic projection apparatus, the apparatus including a radiation system for providing a projection beam of radiation, a support structure for supporting patterning device for imparting a pattern to the projection beam, a substrate table for holding a substrate, and an adjustable projection system for projecting the patterned beam onto a target portion of the substrate so as to produce an image of the patterning device on the target portion, the computer program being arranged to effect a method including predicting changes in projection system aberrations with time with respect to measured aberration values, determining the application-specific effect of said predicted projection system aberration changes on certain parameters of the image of the selected patterning device to be used in the apparatus for producing the specific required patterned beam, generating a control signal specific to the required patterned beam according to said predicted projection system aberration changes and their application-specific effect on certain parameters of the image; and carrying out imaging adjustments in dependence on the control signal to compensate for the application-specific effect of said predicted changes in the aberrations on the image of the selected patterning device.

BRIEF DESCRIPTION OF THE DRAWINGS

An embodiment of the invention will now be described, by way of example only, with reference to the accompanying drawings, in which.

DETAILED DESCRIPTION OF EMBODIMENTS OF THE INVENTION

Figure 1:
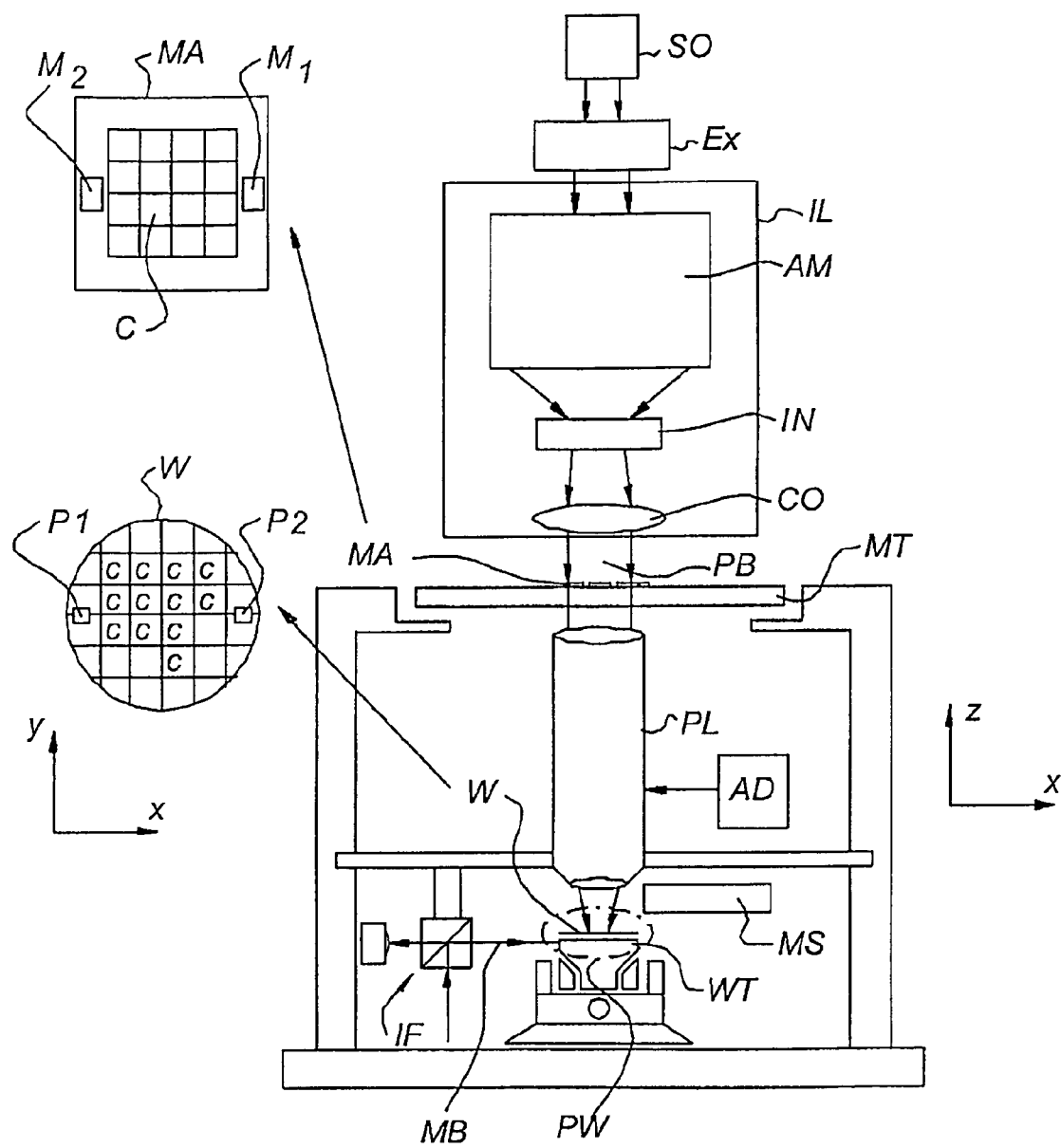
FIG. 1 depicts lithographic projection apparatus for carrying the invention into effect.

FIG. 1 schematically depicts lithographic projection apparatus comprising at least one marker structure in accordance with an embodiment of the invention. The apparatus comprises:

- an illumination system IL for providing a projection beam PB of radiation (e.g. UV or EUV radiation). In this particular case, the radiation system also comprises a radiation source SO;
- a first support structure MT (e.g. a mask table) for supporting a patterning device, MA (e.g. a mask) and connected to first positioner (not shown) for accurately positioning the patterning device with respect to item PL;
- a second support structure WT (e.g. a wafer table) for holding a substrate, W (e.g. a resist-coated silicon wafer) and connected to second positioner PW for accurately positioning the substrate with respect to item PL; and
- a projection system PL (e.g. a reflective projection lens) for imaging a pattern imported to the projection beam PB by patterning device MA onto a target portion C (e.g. comprising one or more dies) of the substrate W.

The projection system PL is provided with an actuating device AD for adapting the optical settings of the system. The operation of adapting the optical settings will be explained hereinafter in more detail.

As depicted here, the apparatus is of a transmissive type (i.e. has a transmissive mask). However the apparatus may alternatively be of a reflective type (with a reflective mask). Alternatively the apparatus may employ another kind of patterning device, such as a programmable mirror array of a type as referred to above.

The source SO (e.g. a mercury lamp or an excimer laser) produces a beam of radiation. This beam is fed into an illumination system (illuminator) IL, either directly or after having traversed a beam conditioner, such as a beam expander Ex, for example. The illumination system IL may comprise adjustable optical element AM for setting the outer and/or inner radial extent (commonly referred to as σ-outer and σ-inner, respectively) of the intensity distribution of the beam PB. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source SO may be within the housing of the lithographic projection apparatus (as is often the case when the source SO is a mercury lamp, for example), but that the source SO may also be remote from the lithographic projection apparatus, the beam which it produces being led into the apparatus (e.g. with the aid of suitable directing mirrors). This latter scenario is often the case when the source SO is an excimer laser. The present invention is applicable to both of these scenarios.

The beam PB is incident on the mask MA, which is held on the mask table MT. Having traversed the mask MA, the beam PB passes through the lens PL, which focuses the beam PB onto a target portion C of the substrate W. With the aid of the second positioner PW and interferometer IF, the substrate table WT can be moved accurately, e.g. so as to position different target portions C in the path of the beam PB. Similarly, the first positioner (acting on the mask table MT) can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly shown in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT and the substrate table WT are kept essentially stationary, and an entire pattern imported to the beam PB is projected in one go (i.e. a single "flash") onto a target portion C. The substrate table WT is then shifted in the X and/or Y directions so that a different target portion C can be irradiated by the beam PB.

2. In scan mode, essentially the same scenario applies, except that a given target portion C is not exposed in a single "flash". Instead, the mask table MT is movable in a given direction (the so-called "scan direction", e.g. the Y-direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

In a non-illustrated variant embodiment the substrate table is replaced by a twin-stage arrangement comprising two substrate tables to which the wafers are supplied so that, whilst one of the wafers is being exposed in one or other of the different modes described above, another of the wafers is being subjected to the necessary measurements to be carried out prior to exposure, with a view to decreasing the amount of time that each wafer is within the exposure zone and thus increasing the throughput of the apparatus.

The interferometer typically can comprise a light source, such as a laser (not shown), and one or more interferometers for determining some information (e.g. position, alignment, etc.) regarding an object to be measured, such as a substrate or a stage. In FIG. 1, a single interferometer IF is schematically depicted by way of example. The light source (laser) produces a metrology beam MB which is routed to the interferometer IF by one or more beam manipulators. In the case where more than one interferometer is present, the metrology beam is shared between them, by using optics that split the metrology beam into separate beams for the different interferometers.

A substrate alignment system MS for alignment of a substrate on the table WT with a mask on the mask table MT, is schematically shown at an exemplary location close to the table WT, and comprises at least one light source which generates a light beam aimed at a marker structure on the substrate W and at least one sensor device which detects an optical signal from that marker structure. It is to be noted that the location of the substrate alignment system MS depends on design conditions which may vary with the actual type of lithographic projection apparatus.

Furthermore the lithographic projection apparatus comprises an electronic control system in the form of a computer arrangement which is capable of controlling and adjusting machine parameters during execution of a series of imaging and exposure steps during processing of a lot of wafers using a common mask. The computer arrangement as used in an embodiment of the invention comprises a host processor connected to memory units which store instructions and data, one or more reading units for reading CD ROM's for example, input devices such as a keyboard and a mouse, and output devices such as a monitor and a printer. An input/output (I/O) device is also connected to the lithographic projection apparatus for handling control signals transmitted to and received from actuators and sensors, which take part in controlling of the projection system PL in accordance with the present invention.

As explained previously, when the projection beam radiation PB passes through the projection lens system PL, part of it is absorbed in lens elements and coating materials. This partial absorption causes global and local temperature and refractive index changes in the lens elements. This results in changes in the optical performance of the lens, which can be characterized as lens aberration. The overall aberration can be decomposed into a number of different types of aberration, such as spherical aberration, astigmatism and so on. The overall aberration is the sum of these different aberrations, each with a particular magnitude given by a coefficient. Aberration results in a deformation in the wave front and different types of aberration represent different functions by which the wave front is deformed. These functions may take the form of the product of a polynomial in the radial position r and an angular function in sine or cosine of $m\theta$, where r and $\theta$ are polar coordinates and m is an integer. One such functional expansion is the Zernike expansion in which each Zernike polynomial represents a different type of aberration and the contribution of each aberration is given by a Zernike coefficient, as will be described in more detail below.

Particular types of aberration, such as focus drift and aberrations with even values of m (or m=0) in the angular functions dependent on $m\theta$, can be compensated for by way of image parameters for effecting adjustment of the apparatus in such a manner as to displace the projected image in the vertical (z) direction. Other aberrations, such as coma, and aberrations with an odd value of m can be compensated for by way of image parameters for effecting adjustment of the apparatus in such a manner as to produce a lateral shift in the image position in the horizontal plane (the x,y-plane).

The best-focus (BF) position, i.e. z-position of the image, can be measured using the actual lithographic projection apparatus. The best-focus position is the z-position with maximum contrast, for example the position as defined by the maximum of a sixth-order polynomial fit to the contrast-versus-position curve as the position is moved from defocus, through focus and on to defocus. The best-focus can be determined experimentally using known techniques, such as the technique known as "FOCAL" (described below); alternatively, one may directly measure the aerial image, for example by using a transmission image sensor (TIS) (described below) or commercial focus monitor.

FOCAL is an acronym for focus calibration by using alignment. It is a best-focus measurement technique for completely determining information about the focal plane using the alignment system of the lithographic apparatus. A special, asymmetrically segmented alignment mark is imaged through focus on to a resist coated wafer. The position of this imaged mark (latent or developed) can be measured by the alignment system. Due to the asymmetric segmentation, the position measured by the alignment system will depend on the defocus used during exposure, thus allowing determination of the best-focus position. By distributing these marks over the whole image field and using different orientation for the segmentation, the complete focal plane for several structure orientations can be measured. This technique is described in more detail in U.S. Pat. No. 5,674,650 incorporated herein by reference.

One or more transmission image sensors (TIS) can be used to determine the lateral position and best focus position (i.e. horizontal and vertical position) of the projected image from the mask under the projection lens. A transmission image sensor (TIS) is inset into a physical reference surface associated with the substrate table (WT). To determine the position of the focal plane, the projection lens projects into space an image of a pattern provided on the mask MA (or on a mask table fiducial plate) and having contrasting light and dark regions. The substrate stage is then scanned horizontally (in one or possibly two directions, e.g. the x and y directions) and vertically so that the aperture of the TIS passes through the space where the aerial image is expected to be. As the TIS aperture passes through the light and dark portions of the image of the TIS pattern, the output of the photodetector will fluctuate (a Moiré effect). The vertical level at which the rate of change of amplitude of the photodetector output is highest indicates the level at which the image of TIS pattern has the greatest contrast and hence indicates the plane of optimum focus. The x, y-positions of the TIS aperture at which the rate of change of amplitude of the photodetector output during said horizontal scan is highest, are indicative of the aerial lateral position of the image. An example of a TIS detection arrangement of this type is described in greater detail in U.S. Pat. No. 4,540,277 incorporated herein by reference.

The measurement of other imaging parameters is described in U.S. Pat. No. 6,563,564.

Other techniques can also be used to analyze the image. For example, a so-called ILIAS sensing arrangement as described in WO 01/63233 may be used.

From these measurements of the image position, it is possible to obtain the Zernike coefficients of the different forms of aberration. This is explained more fully in, for example, European Patent Application No. EP 1128217A2 incorporated herein by reference.

The lens heating effect is also in general dependent on parameters such as the illumination setting, mask transmission, mask structure, field size and shape, light intensity, wafer reflectivity and wafer layout, so it is difficult to calculate from first principles and is generally empirical. The lens heating effect also varies dynamically with time, and so, in order to correct for this lens heating effect, the present embodiment employs a model of the effects of lens heating based on previous measurements, optionally calibrates and fine tunes the model using intermittent measurements, and makes adjustments to the lithographic projection apparatus to keep the lithographic parameters within their respective tolerances.

Considering the aberration effect known as focus drift caused by lens heating, the model employed in this first embodiment is as follows.

$$F(t) = A_1(1 - e^{-t/\tau_1}) + A_2(1 - e^{-t/\tau_2})$$

Thus the drift F as a function of time t, i.e. the change in best focus position in the z-direction relative to its position at t-0, is described by two exponential functions and this has been found to be a good model. Each of the exponential functions has a time-constant, $\tau_1$ and $\tau_2$ respectively, and each has an amplitude, $A_1$ and $A_2$ respectively. The values of the amplitudes and time constants depend on at least a subset of the parameters of illumination setting, mask transmission, mask structure, field size and shape, radiation intensity, wafer reflectivity and wafer layout. The model of this embodiment further assumes a linear dependency of the amplitudes on some of these parameters, and particularly those proportional to the power incident on the lens, such as the light intensity, field size, mask transmission factor and wafer reflectivity, such that the amplitudes may be written as:

$$A_1 = \mu_1 \cdot T_r \cdot S \cdot I \cdot W_{refl}$$

$$A_2 = \mu_2 \cdot T_r \cdot S \cdot I \cdot W_{refl}$$

where I is the exposure light intensity (W/m$^2$), S is the field size or masking area at wafer level (m$^2$), $T_r$ is the mask transmission factor, $W_{refl}$ is the wafer reflectivity (a pure fraction or percentage), and $\mu_{1,2}$ are so-called scaling factors, which are phenomenological and depend on all the other parameters that affect lens heating but that are not specifically included.

In this way, a lens heating database is built up which stores the image parameter values needed to correct for lens heating, and which in this embodiment consists of two time constants ($\tau_1$ and $\tau_2$) and two scaling factors ($\mu_1$ and $\mu_2$). A set of these image parameters can be stored for each mask and illumination setting of interest.

The technique has been described above in terms of focus drift purely as an example of one type of image parameter. Sets of image parameters can also be built up and stored in the database that characterize the change in different aberrations, such as astigmatism and coma, as a function of lens heating (time). The aberrations may depend strongly on the particular mask structure being exposed, and therefore fine tuning measurements can be made using a particular mask to obtain values of these image parameters for different aberrations prior to exposing a particular lot of wafers using that mask. Any mask-specific mask heating effects can also be included in the model.

Having obtained and installed a database of parameters defining the lens heating effect, software is used in a feed forward technique to predict the necessary correction that needs to be made to overcome the effects on image parameters of the aberrations calculated according to the model. This is done for every exposure, and physical adjustments to compensate for the calculated image parameter offsets that need to be corrected can be made immediately before each exposure.

To compensate for variations in heating effects between different masks and at different illumination settings for which fine-tuned parameters have not necessarily been obtained, occasional measurements can also be made intermittently during a lot to dynamically adjust the model. New optimum time constant and/or scaling factor parameters can be calculated after each new measurement by a fit based on for instance a minimization of the residue R. Also, when performing exposures at settings for which parameter values are not available, interpolation or extrapolation from known parameters can be used to give a best estimate for the parameter values to be used for the new setting.

At a particular time, a calculation for each type of aberration effect will give the predicted additional amount of that aberration effect resulting from lens heating, over and above any intrinsic aberration effect, i.e. the default value for the lens. The correction to make to the lithographic projection apparatus in terms of adjustments to be made to the apparatus by way of adjustment signals to further compensate for the lens heating effect depends on each particular type of aberration or image parameter as follows:

Focus drift—adjust substrate table height

Field curvature—shift one or more movable lens elements along the optical axis

Magnification drift—shift one or more movable lens elements along the optical axis and adjust axial position of mask along the optical axis Third-order distortion—adjust axial position of mask along the optical axis and shift one or more movable lens elements along the optical axis Spherical aberration—shift one or more movable lens elements along the optical axis Comatic aberration—shift the central wavelength of the exposure radiation and adjust the degree of decentering with respect to the optical axis of one or more movable lens elements.

It should be noted that the relationships between the aberrations and the required adjustments to the lithographic projection apparatus may differ for different types of lens.

The correction can be performed automatically by the machine, based on tabulated or calculated image parameter values relating the magnitude of the aberration effect to the size of the mechanical adjustment necessary. Saddle-like deformation of one or more lens elements to correct for particular aberrations is described, for example, in WO 99/67683 incorporated herein by reference.

The contribution of each aberration effect will depend on the mask being exposed and the illumination setting. Therefore it will not always be necessary to make adjustments for all of these aberration effects for every exposure or lot of exposures.

The projection system PL is provided with an actuating device AD which is capable of adapting the optical settings of the projection system by way of adjustment signals supplied to the optical elements within the projection system PL in accordance with the calculated image parameters. The actuating device AD is provided with input and output ports for exchanging control signals with the computer arrangement.

Figure 2:
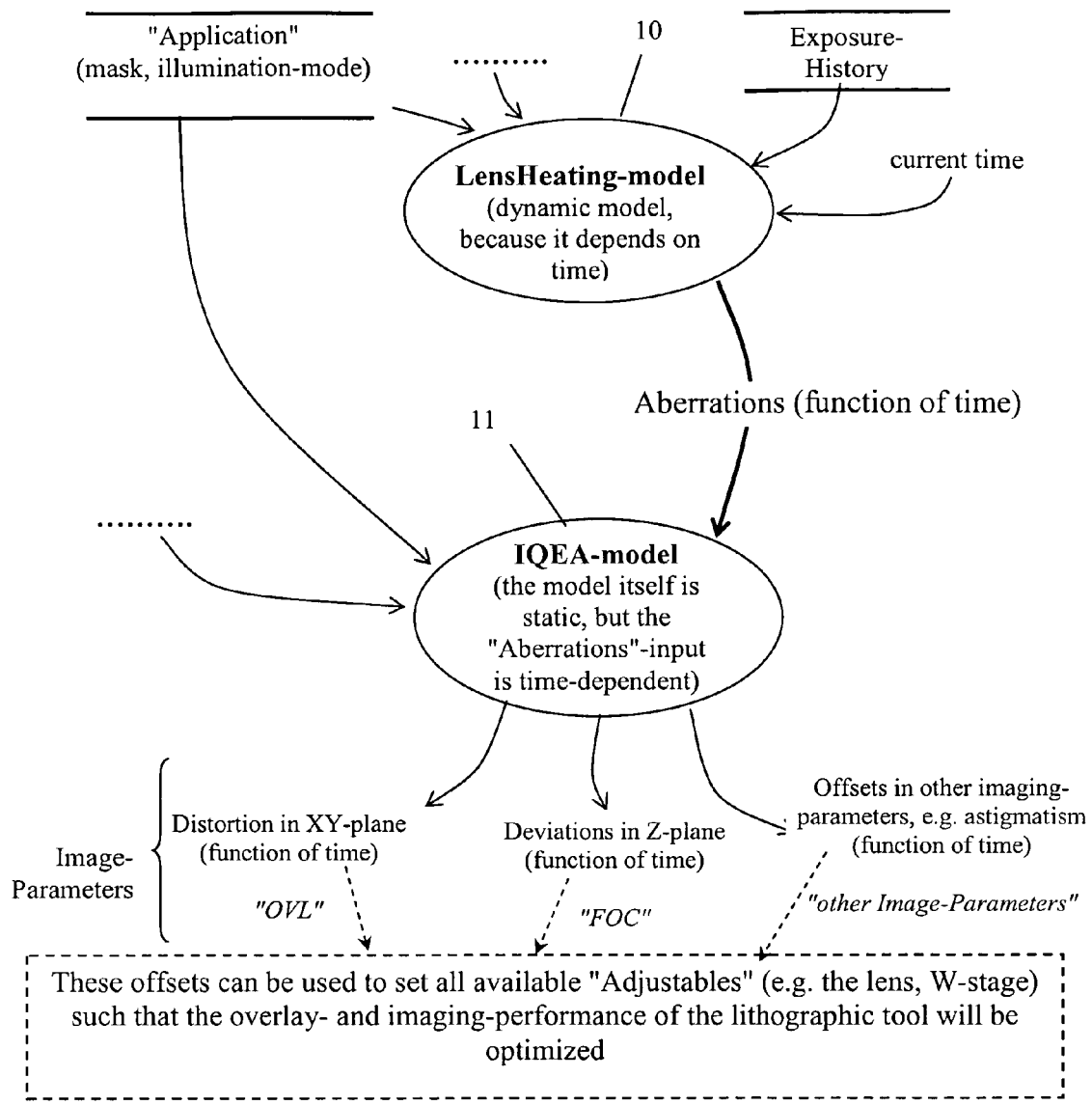
FIG. 2 is an explanatory diagram showing the coupling between a lens heating model and an IQEA model.

The computer arrangement is used to manipulate data using a combination of a lens heating model 10 and an IQEA model 11 (where IQEA denotes image quality effects of aberrations), as shown in the data flow diagram of FIG. 2. The lens heating model (which may be, for example, as described in U.S. Pat. No. 6,563,564) is a dynamic model which predicts changes in the aberrations, that is the aberration offset data, with time due to heating of the lens, and which receives as input data indicative of the particular application, such as the product pattern, the illumination mode, etc., as well as data indicative of the exposure history, that is the data indicative of the timestamp, dose, image size, reticle transmission, etc. of each of the exposures that have previously been carried out in the lot, and the current time. The lens heating model provides aberration offset output signals (expressed in Zernikes). The IQEA model also receives data indicative of the particular application (product pattern, illumination mode) and the user-defined lithographic specification, as well as aberration offset data indicative of the predicted aberration changes from the lens heating model, and provides output signals indicative of the image parameter offsets, such as distortions in the X-Y plane, deviations in the Z plane, and offsets in other image parameters, e.g. astigmatism. Such image parameter offset output signals effect the required adjustments to compensate for the aberrations of most relevance to the particular application, such adjustments being effected by way of adjustment signals supplied to one or more lenses of the projection system, and/or other adjustable parts of the apparatus, such as the substrate table, depending on the aberrations to be compensated for to optimize the overlay and imaging performance of the lithographic projection apparatus. Such image parameter offset output signals will vary with time by virtue of the fact that the aberration values outputted by the lens heating model will vary with time, and may serve to adjust for distortions in the XY-plane, deviations in the Z-plane normal to the XY-plane, or to adjust for offsets in more general imaging parameters, e.g. on-axis astigmatism. Other image parameter output signals may serve to adjust the CD or L1L2 for example.

Figure 3:
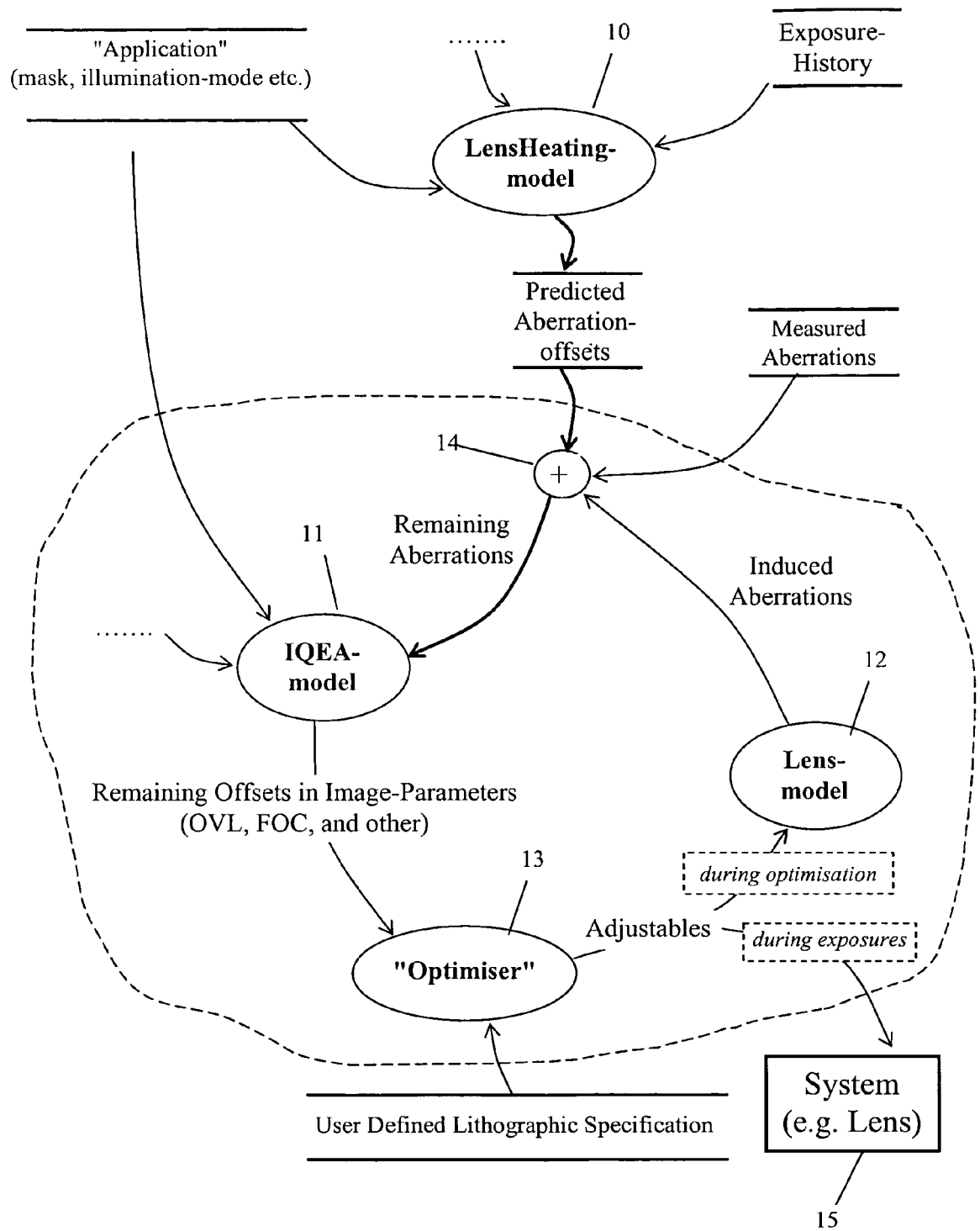
FIGS. 3 and 3a are explanatory diagram illustrating two practical implementations of the invention.

In a further implementation, as shown in the data flow diagram of FIG. 3, the lens heating model 10 and the IQEA model 11 are combined with a lens model 12 and optimizer 13. The lens model 12 (not to be confused with the lens heating model 10) provides an indication of the setting of the various lens adjustment elements that will give optimal lithographic performance for the particular lens arrangement used as will be described in more detail below, and can be used together with the IQEA model (and the predicted aberration offsets from the lens heating model) to optimize the overlay and imaging performance of the lithographic apparatus during exposure of a lot of wafers. To this end the predicted image parameter offsets (overlay, focus, etc. from the IQEA model 11 are supplied to the optimizer 13 which determines the adjustment signals for which the remaining offsets in the image parameters will be minimized according to the user-defined lithographic specification (which will include for example the relative weighting to be allotted to overlay errors and focus errors and will determine to what extent the maximum allowed value for the overlay error (dX) over the slit for example will be counted in the merit function indicating optimal image quality as compared with the maximum allowed value for the focus error (dF) over the slit). The parameters of the lens model 12 are calibrated off-line.

During an optimization phase the adjustment signals are supplied by the optimizer 13 to the lens model 12 which determines the aberrations that would be induced in the lens if such adjustment signals were supplied to the lens. These induced aberrations are supplied to an adder 14 along with the predicted aberrations offsets from the lens heating model 10 and any measured aberration values; such that only the remaining aberrations are fed back to the IQEA model 11. The measured aberration values are supplied as a result of the previously described measurements at the start of the lot, and the aberration offsets with respect to the last measured values are predicted by the lens heating model 10. Following such optimization of the image parameters, the resultant adjustment signals are supplied to the lens 15 or other adjustable element to effect the necessary compensating adjustments prior to exposure of the wafers.

Figure 3A:
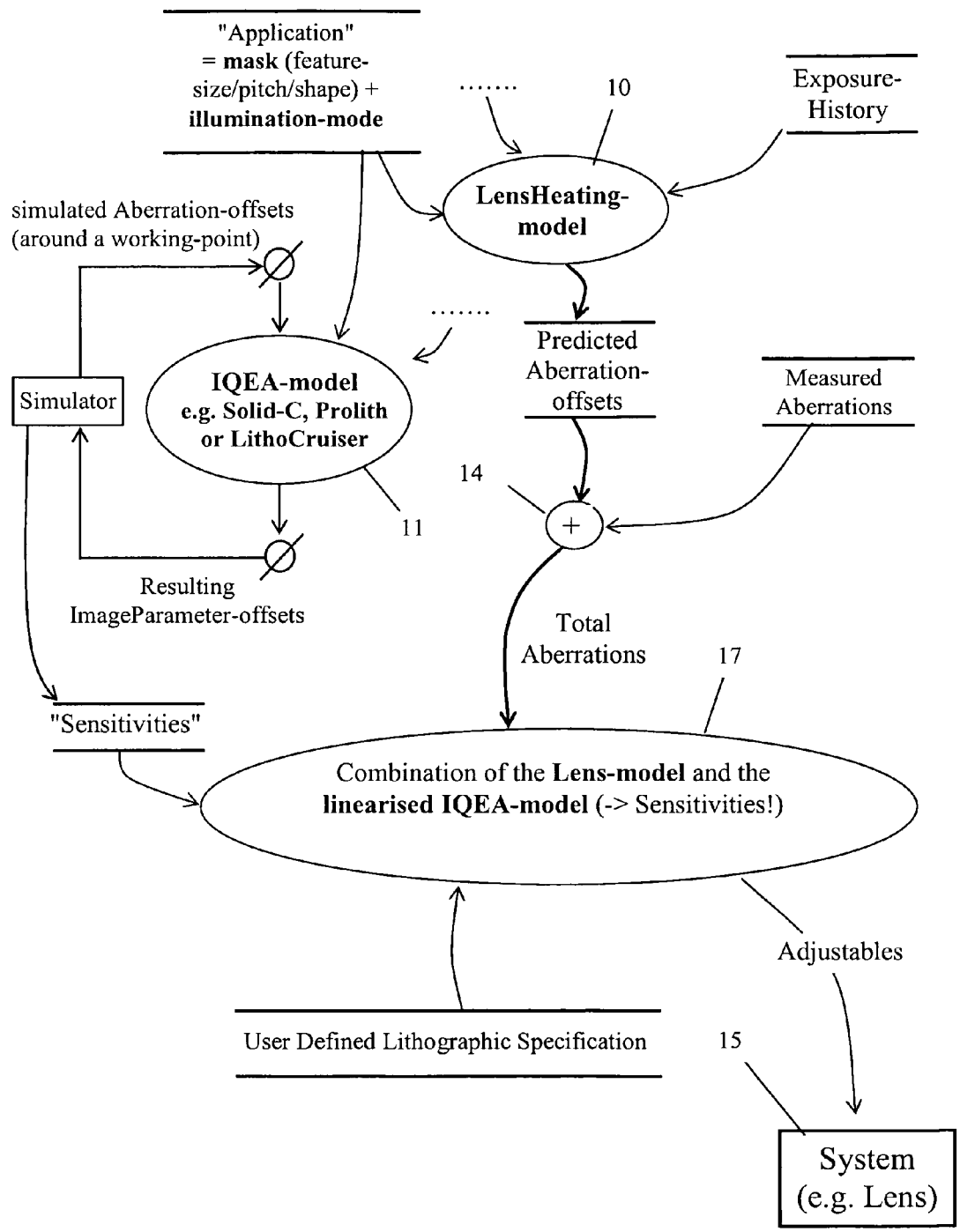

FIG. 3a is a diagram of a modification of such an implementation in which a combination 17 of a lens model and a linearized IQEA model is provided to enable optimization of the adjustment signals in accordance with the user-defined lithographic specification to be implemented in one run (rather than separate runs having to be carried out for each of the image parameters to be optimized). The linearized IQEA model is derived from the IQEA model 11 as described in more detail below with reference to two possible methods for combining the lens model and a linearized IQEA model. In this case the optimized adjustment signals are supplied directly to the lens 15 or other adjustable element to effect the necessary compensating adjustments prior to exposure of the wafers, without it being necessary to feed back induced aberration values corresponding to the adjustment signals in the manner previously described.

The overall aberration can be decomposed into a number of different types of aberration, such as spherical aberration, astigmatism and so on. The overall aberration is the sum of these different aberrations, each with a particular magnitude given by a coefficient. Aberration results in a deformation in the wave front and different types of aberration represent different functions by which the wave front is deformed. These functions may take the form of the product of a polynomial in the radial position r and an angular function in sine or cosine of $m\theta$, where r and $\theta$ are polar coordinates and m is an integer. One such functional expansion is the Zernike expansion in which each Zernike polynomial represents a different type of aberration and the contribution of each aberration is given by a Zernike coefficient:

$$W(\rho, \theta) = \sum_{n=0}^{N} \sum_{\substack{l=-n \\ step\ 2}}^{n} A_{n,l} \cdot R_n^l(\rho) \cdot e^{i \cdot l \cdot \theta} \quad (1)$$

where
W is the phase distribution in the pupil plane, as function of position in the pupil [nm]
$A_{n,l}$ is the aberration or Zernike coefficient [nm]
$R_n^l$ is a polynomial of order n, and dependent on l.
$\rho$ is the radius in the pupil plane [units of NA]
$\theta$ is the angle in the pupil [rad]
n is the power of $\rho$ ($0 \leq n \leq N$)
N is the order of the pupil expansion
l is the order of $\theta$ (n+l=even and $-n \leq l \leq n$)
The aberration coefficient $A_{n,l}$ is usually written as Zernike coefficient $Z_i$:

$$A_{n,i} = a_i \cdot Z_i, \quad (2)$$

where
$a_i$ is a scaling factor
i is $n^2+n+l+1$
The aberrations and thus also the Zernike coefficients are a function of the position in the image plane: $Z_i = Z_i(X,Y)$. However, in a scanner the aberrations in the y-direction are averaged out during the scanned exposure, so that $Z_i(X,Y)$ becomes $\bar{Z}_i(X)$ (which is usually just referred to as $Z_i(X)$).

The function of the aberrations (Zernike coefficient) across the image plane can in turn be described by a simple series expansion:

$$Z_i(X) = Z_{i\_0} + Z_{i\_1} \cdot X + Z_{i\_3} \cdot X^3 + Z_{i\_res}(X), \quad (3)$$

where $Z_i(X)$ is described as the sum of a constant term (with coefficient $Z_{i\_0}$), a linear term (with coefficient $Z_{i\_1}$), etc. and a remaining term or residuals ($Z_{i\_res}$).

The linear and third order terms of the low order odd aberrations ($Z_{2\_1}, Z_{2\_3}$) are referred to as the magnification and third order distortion. However, there are also for instance linear terms of higher order odd aberrations (eg. $Z_{7\_1}$ or coma tilt) which have a magnification effect (but depending on the exposed image, illumination setting and mask type). The second order of the lower order even aberration ($Z_{4\_2}$) is usually referred to as the field curvature.

The lens model is used to calculate the lens settings (adjustable lens element positions and tilts) that give optimal lithographic performance. For instance the lens of one particular system is able to adjust the following parameters: $Z_{2\_1}$, $Z_{2\_3}$, $Z_{4\_2}$, $Z_{7\_1}$, $Z_{9\_0}$, $Z_{14\_1}$, $Z_{16\_0}$ The following equations represent a simplified example of the lens model:

$$Z_{2\_1} = A*E1 + B*E2 + C*E3$$

$$Z_{7\_1} = D*E1 + F*E2 + G*E3$$

$$Z_{9\_0} = H*E1 + K*E2 + N*E3$$

$$Z_{14\_1} = P*E1 + Q*E2 + R*E3 \quad (4)$$

or in matrix notation:

$$\overline{Z}_{adj} = \begin{pmatrix} Z_{2\_1} \\ Z_{7\_1} \\ Z_{9\_0} \\ Z_{14\_1} \end{pmatrix} = \begin{pmatrix} A & B & C \\ D & F & G \\ H & K & N \\ P & Q & R \end{pmatrix} \cdot \begin{pmatrix} E1 \\ E2 \\ E3 \end{pmatrix} = M \cdot \overline{E} \quad (5)$$

where M is the dependencies matrix and $\overline{E}$ is the lens element vector A simulator uses the IQEA model to determine, from the characteristics of the product features and the illumination settings used, the so-called sensitivities ($S_i$) for the different aberration coefficients ($Z_i$) and these sensitivities constitute the linearized IQEA_model. This is done by using commercial packages, such as Prolith, Solid-C or Lithocruiser (from ASML Masktools), that are able to calculate the projected aerial image based on the characteristics of the feature, the illumination setting, and the lens type and aberrations. From the aerial image the relevant lithographic errors can be calculated, such as X-displacement (the distribution of X- and Y-displacement errors being usually referred to as distortion), Z-displacement (called defocus and the distribution of Z-displacement errors being usually referred as focal plane deviation), C-D difference (critical dimension difference for brickwall features), left-right asymmetry, H-V litho errors, etc. The sensitivities are calculated by dividing the calculated error by the amount of aberration put into the simulator. This is done for all the relevant lithographic errors and aberrations (expressed in Zernikes).

By multiplying the calculated sensitivities by the aberrations of the lens, the lithographic errors of the system are obtained across the image field (scanner slit). For example, an overlay error is the X-distortion (dx), and the X-distortion of a certain feature exposed with a certain illumination setting becomes:

$$dx(X) = \sum_i Z_i(X) \cdot S_i \quad (6)$$

$(i = 2, 7, 10, 14, 19, 23, 26, 30 \text{ and } 34)$.

And the defocus (dF) across the slit (for a vertical feature) becomes:

$$dF(X) = \sum_i Z_i(X) \cdot S_i \quad (7)$$

$(i = 4, 5, 9, 12, 16, 17, 21, 25, 28, 32 \text{ and } 36)$.

Depending on the user defined lithographic specification, other lithographic errors also need to be taken into account. In general most lithographic errors can be written as:

$$E(X) = \sum_i Z_i(X) \cdot S_i \quad (8)$$

$(i = 2, 3, \ldots 36)$.

If the lens model is used without also applying the IQEA model, all the aberrations (in this example $Z2\_1$, $Z7\_1$, $Z9\_0$ and $Z14\_1$) are optimized at the same time. Because there are less lens elements to adjust than there are parameters to optimize, the total system may be placed in the optimum state but the individual image parameters may not be optimal for the particular application. Furthermore the optimal state for all tunable parameters together might not give the optimal performance.

By combining the IQEA model with the lens model, it is possible to make the correction-method much more flexible and powerful (it can be optimized for the appropriate applications).

Two possible methods for combining the lens model and the IQEA model are discussed below: The simplest method for combining the two models is by applying the calculated sensitivities ($S_i$) from the IQEA model in the lens model:

$$\overline{Z}_{adj} = \begin{pmatrix} Z'_{2\_1} \\ Z'_{7\_1} \\ Z'_{9\_0} \\ Z'_{14\_1} \end{pmatrix} \quad (9)$$

$$= \begin{pmatrix} Z_{2\_1} \cdot S_2 \\ Z_{7\_1} \cdot S_7 \\ Z_{9\_0} \cdot S_9 \\ Z_{14\_1} \cdot S_{14} \end{pmatrix}$$

$$= \begin{pmatrix} A \cdot S_2 & B \cdot S_2 & C \cdot S_2 \\ D \cdot S_7 & F \cdot S_7 & G \cdot S_7 \\ H \cdot S_9 & K \cdot S_9 & N \cdot S_9 \\ P \cdot S_{14} & Q \cdot S_{14} & R \cdot S_{14} \end{pmatrix} \cdot \begin{pmatrix} E1 \\ E2 \\ E3 \end{pmatrix}$$

$$= M' \cdot \overline{E}$$

If for example $S_{14}=0$, the equations become exactly solvable. However, even if none of the sensitivities is zero, the highest sensitivities will get more weight in the final solution, resulting in a state of the system which is optimal for the particular application.

The second method for combining the two models is to optimize the system to one or more lithographic performance indicators. In one possible example the system is optimized for the performance indicator X-distortion (dx) in which case the IQEA model equation for this indicator can be written in the following manner:

$$dx(X) = \sum_i Z_i(X) \cdot S_i \quad (10)$$

$$= \sum_i (Z_{i\_0} + Z_{i\_1} \cdot X + Z_{i\_res}(X)) \cdot S_i$$

-continued $$= \sum_i Z_{i\_1} \cdot S_i \cdot X \sum_i (Z_{i\_0} + Z_{i\_res}(X)) \cdot S_i$$

$$= (Z_{2\_1} \cdot S_2 + Z_{7\_1} \cdot S_7 + Z_{14\_1} \cdot S_{14}) \cdot X + \sum_r Z_{r\_1} \cdot$$

$$S_r \cdot X + \sum_i (Z_{i\_0} + Z_{i\_res}(X)) \cdot S_i$$

$$= (Z_{2\_1} \cdot S_2 + Z_{7\_1} \cdot S_7 + Z_{14\_1} \cdot S_{14}) \cdot X + \text{residuals}$$

where i=2, 7, 10, 14, 19, 23, 26, 30 and 34 and r=10, 19, 23, 26, 30 and 34

If the expressions for the lens adjustments are used for the three linear aberration terms ($Z_{2\_1}$, $Z_{7\_1}$, $Z_{14\_1}$) in this equation, it becomes:

$$dx(X) = (Z_{2\_1} \cdot S_2 + Z_{7\_1} \cdot S_7 + Z_{14\_1} \cdot S_{14}) \cdot X + \text{residuals} \quad (11)$$

$$= (A \cdot E1 + B \cdot E2 + C \cdot E3) \cdot S_2 +$$

$$(D \cdot E1 + F \cdot E2 + G \cdot E3) \cdot S_7 ++$$

$$(P \cdot E1 + Q \cdot E2 + R \cdot E3) \cdot S_{14} + \text{residuals}$$

This equation constitutes the integrated lens model equation which needs to be solved. In reality there will be more lithographic errors that have to be optimized at the same time, making the solution more complex. For instance, if there is a requirement to optimize the defocus (dF), the second equation to be solved becomes:

$$dF(X) = Z_{9\_0} \cdot S_9 + \text{residuals} \quad (12)$$

$$= (H * E1 + K * E2 + N * E3) \cdot S_9 + \text{residuals}$$

In this case both dx and dF need to become minimized by adjusting the lens elements.

In cases where there are an excess number of degrees of freedom, it is sensible to use this to make individual adjustable aberrations as small as possible, in order to make the general performance of the system as good as possible.

Figure 4:
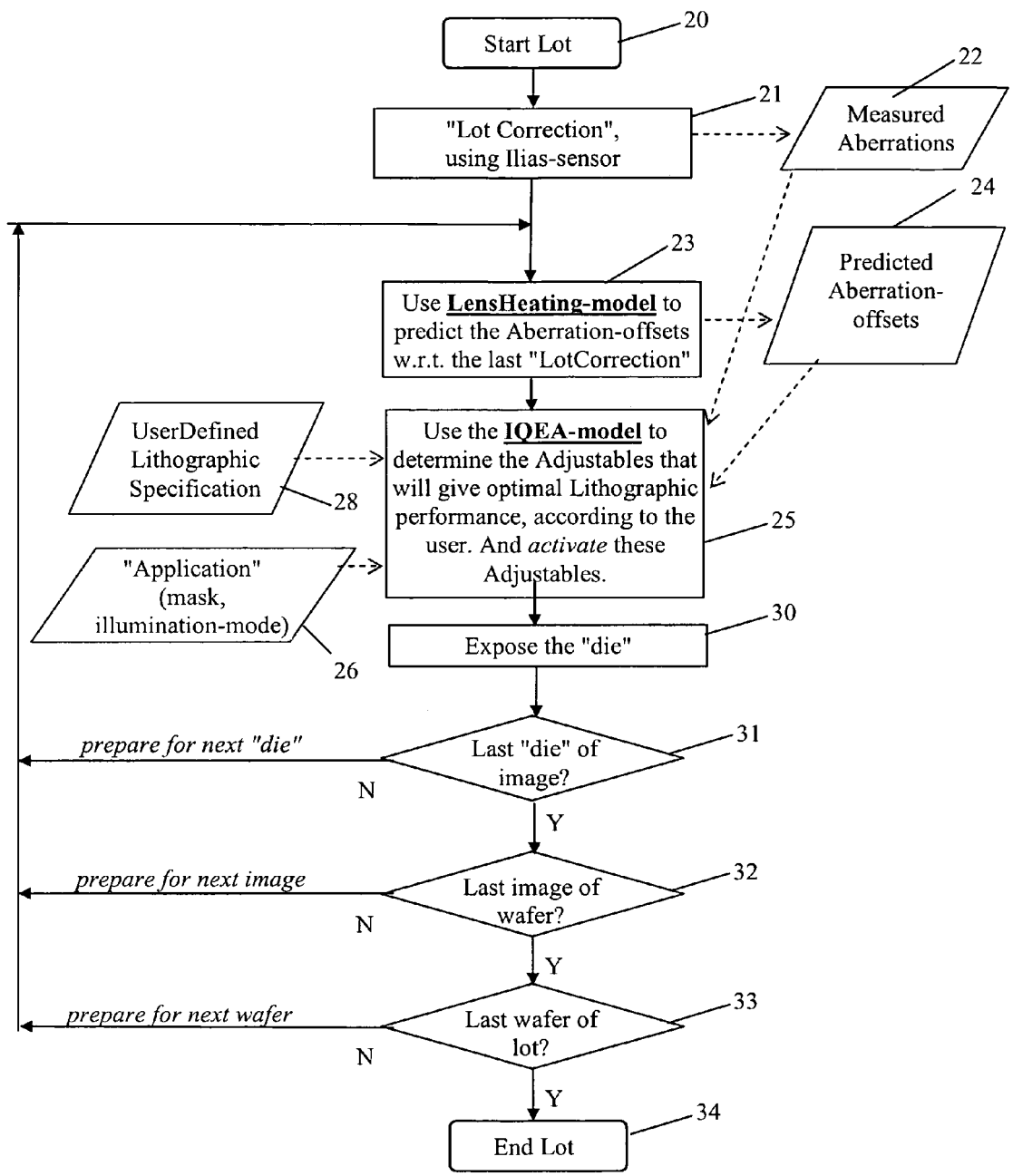
FIGS. 4 and 5 are flow charts of the control steps to be carried out in implementing particular embodiments in a computer system.

The computer arrangement is capable of controlling and adjusting the settings of the projection system, as shown by the flow chart of FIG. 4, in such a way that, during each exposure in a sequence of multiple die exposures of a lot of wafers, the changes in the aberrations due to lens heating which the particular application is most sensitive to are compensated for optimally for the exposure of each successive die of each wafer. Therefore, at the start of the exposure of the lot of wafers as indicated by the start lot box 20, a lot correction procedure 21 is performed in which, prior to the sequence of exposures of the lot, the aberrations of the image are measured, for example, by the ILIAS or TIS technique, to provide measured aberration data 22. The resulting aberration values are supplied to the IQEA model as described in more detail below. The lens heating model is then used in a processing step 23 to predict the aberration offset data 24 due to lens heating for each successive exposure, the lens heating model receiving data indicative of the exposure history (e.g. the number of earlier exposures in the lot, and their time stamps). Such aberration offset prediction is performed for each successive exposure in the lot on the basis of predicted changes in the aberrations with respect to the last lot correction in advance of actual exposure.

In a processing step 25 an IQEA model receives measured aberration data 22 and the aberration offset data 24, as well as the application data 26, that is the data indicative of the particular application, such as the illumination mode (e.g. numerical aperture, sigma inner and outer), the features to be defined in the product with high accuracy (e.g. feature size, density), the dose of radiation to be applied during the exposure, the mask transmission, etc., and data 28 indicative of the user defined lithographic specification defining the sensitivities of different features to different aberration types. The IQEA model together with an appropriate optimizer determines from this data the modeled image parameter offsets, for adjustment of the appropriate settings, such as overlay values (X-Y adjustment), focus values (Z adjustment), for optimizing the imaging performance for each exposure as will be described below. The appropriate die on the wafer is then exposed with these settings in a processing step 30, and it is determined at 31 whether or not the last die of the image has been exposed, and a control signal transmitted to initiate the processing step 23 for the next die of the image where appropriate. In the event that all the dies of the image have been exposed, it is determined at 32 whether or not the last image of the wafer has been exposed, and a control signal transmitted to initiate the series of processing steps 23 for the next image where appropriate. In the event that all the images of the wafer have been exposed, it is determined at 33 whether or not the last wafer of the lot has been exposed, and a control signal transmitted to signal the end of the exposure of the lot of wafers, as indicated at 34.

In a variant of this embodiment a realignment procedure is performed in which the positions of four alignment markers on the mask are detected, and, in the event that one or more of the image parameter offsets exceeds a threshold, some of the image parameters, such as the magnification for example, are re-measured with the result that these particular image parameters will be measured more frequently than just once at the start of a lot. Since such realignment is done on markers on the mask, which are separate from the product pattern, care must be taken to ensure that the remaining aberrations do not adversely affect measurement of the markers during such realignment. In this regard the IQEA model can be used to predict the image parameter offsets that are of most relevance to the detection of the markers on the mask in order to enable the corresponding aberrations to be compensated for so that they do not adversely affect measurement of the markers during the realignment. Whilst it is advantageous to incorporate such a realignment procedure in the control and adjustment of the settings of the projection system, it should be appreciated that the use of such a procedure is optional and that effective control and adjustment of the projection system settings is also possible in the absence of any realignment procedure.

Figure 5:
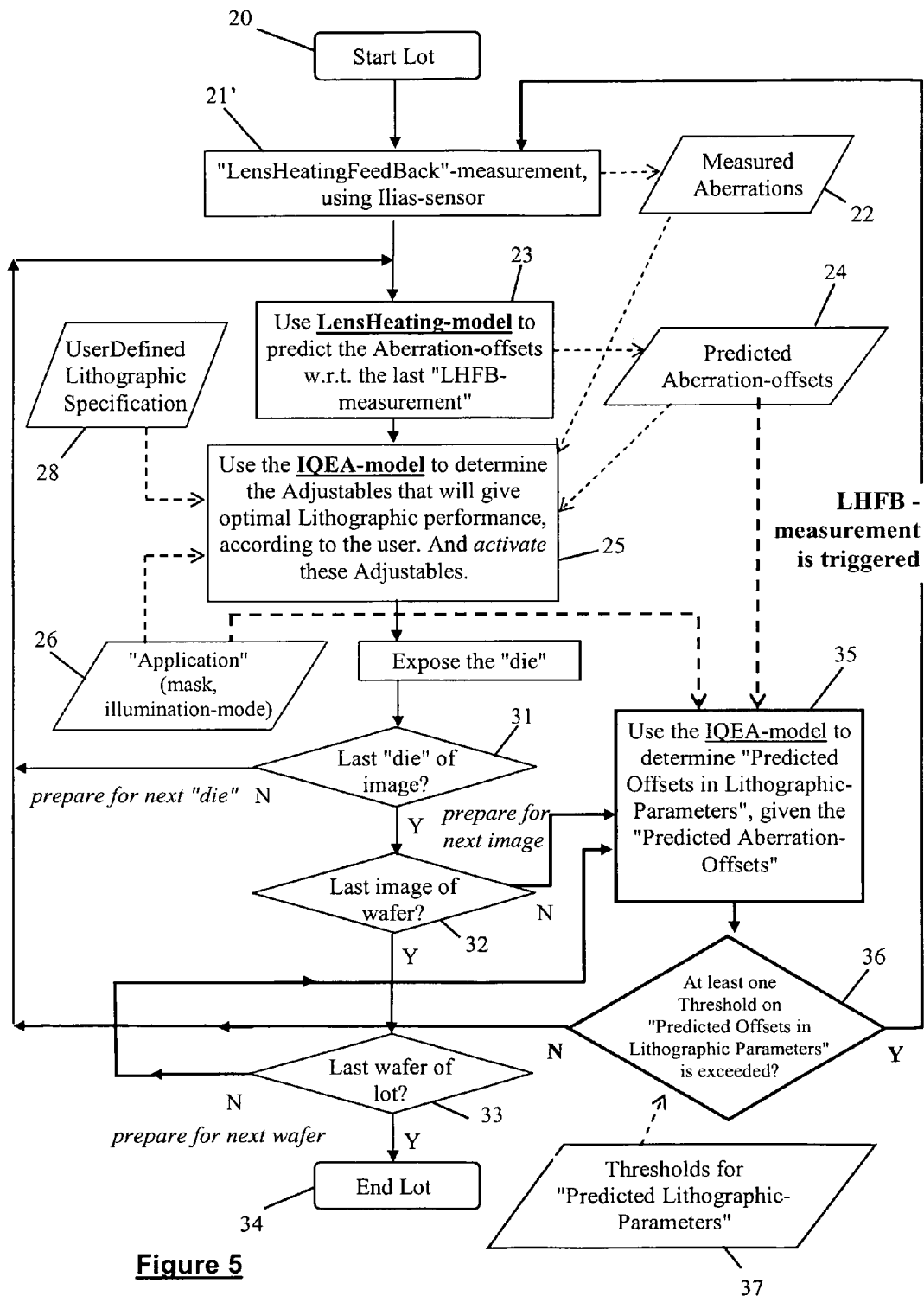

FIG. 5 is a flow chart of an alternative method for controlling and adjusting the settings of the projection system, with the differences over the flow chart of FIG. 3 being shown in bold In this case a lens heating feedback system is provided in which the predicted aberration offset data 24 and application data 26 are inputted into the IQEA model in a processing step 35 so that, prior to the exposure of a further image on a wafer or a further wafer, the predicted image parameter offsets are compared at 36 to threshold data held at 36. In the event that one or more of the image parameter offset values exceeds the corresponding threshold value, a feedback control signal is supplied to cause the aberrations of the image to be re-measured in a further measurement step, so that such newly measured aberration values are used in determination of the total aberration values to be used in the calculation of the image parameter offsets for controlling the optimal lens settings for the exposure of the next image or wafer, in place of the previously measured aberration values. The exposure of each image on each wafer is controlled in similar manner with the optimal lens settings being adjusted for each image where necessary to take account of further heating of the lens, and realignment (by re-measurement of the aberrations) occurring only when necessary as determined by the predicted image parameter offsets exceeding the threshold values.

In this manner the imaging and overlay performance of the apparatus is optimized for the particular application and to compensate for the effect of lens heating whilst ensuring that realignment, and the consequent decrease in throughput, occurs only when necessary. This is achieved by controlling the applied corrections according to the application and particularly in dependence on the features of the critical structures of the product, such as the gates of transistors in the front end layer of a wafer for example.

The procedure for these computations will be explained in more detail below. As a first step the lens aberrations measured for the projection system need to be described, for example in terms of Zernike coefficients.

A linear estimation computation model is used that implements an adaptation of projection system settings based on a linear combination of the sensitivities of the image to distortion with respect to all of the Zernike coefficients. Basically, a distortion of an ideal pattern feature with a given ideal centroid position will relatively shift the centroid position. For the different types of distortion as defined by the Zernike coefficients, the sensitivities of a given pattern feature to distortion will differ, but can be calculated based on a distortion map depending on a "co-ordinate by co-ordinate" or "slit co-ordinate" based approach.

Furthermore, the sensitivity to a given distortion type varies with the shape of the (basic) pattern feature to be imaged. Therefore the linear estimation computation model computes (for example in an off-line mode) the aberration induced distortion parameters for a variety of pattern features (variation of shape and size) in combination with the local lens aberrations of the projection system. Also, the illumination mode and mask type (i.e. the pupil plane filling) is taken into account.

Using the linear estimation computation model the distortion (dx, dy) on a co-ordinate (x, y) is described by:

$$dx(x, y) = \sum_{i=7,10,14,...} Z_i(x, y) \cdot S_i$$

$$dy(x, y) = \sum_{i=8,11,15,...} Z_i(x, y) \cdot S_i$$

where $Z_i$ is a Zernike coefficient of $i^{th}$ order, $S_i$ is a sensitivity coefficient for a given Zernike coefficient $Z_i$, with the x-distortion and the y-distortion each being described by a series of Zernike coefficients. The Zernike coefficients depend on the x, y coordinate. The sensitivities $S_i$ basically depend on the pattern, and the illumination mode.

The results of the computations of these equations are stored in the memory of the computer arrangement 8 in one or more databases as imaging correction data. The imaging correction data can be determined for any given combination of pattern feature type and size, and pupil plane filling. The one or more databases may hold imaging correction data as a function of each of such combinations.

During the lithographic processing run, the imaging correction data is retrieved from the memory. The projection system settings are adapted in accordance with a combination of pattern distortion parameters, namely the type and size of the pattern feature to be imaged, the actual lens aberrations co-ordinate and the actual pupil plane filling for that pattern feature. The imaging correction data (based on the combination of actual pattern distortion parameters) can be made available from the database through information in the job data file for the processing run to an on-line adaptation procedure. The on-line adaptation procedure adapts, by way of I/O device 31, the projection system settings during the processing run in accordance with the imaging correction parameters for aberration induced distortion as given by equations.

Again, during the lithographic processing run, the combination of actual imaging correction parameters can be made available from the database through information in the job data file for the processing run to an on-line adaptation procedure. The on-line adaptation procedure adapts the projection system settings during the processing run in accordance with the imaging correction parameters for aberration induced distortion as given by the equations sets.

The correction of the aerial image for pattern aberration induced distortion and the on-line adaptation procedure are carried out by the computer arrangement. The computations are performed by the processor, data relating to correction parameters for the projection system being stored in the memory units of the computer arrangement. The processor determines the imaging correction parameters and instructs the I/O device to transmit imaging correction signals to the actuating device AD of the projection system which comprises sensors and actuators for correcting the pattern aberration induced distortion during the processing run.

Reference has already been made above to the use of one or more transmission image sensors (TIS) mounted within a physical reference surface associated with the substrate table (WT) which may be used to determine the position of one or more marks on the mask (or reticle), as described in U.S. Pat. No. 4,540,277, in order to adjust the mask alignment (overlay). Advanced process control (APC) systems are commonly used to ensure good overlay. After exposure of a lot, the overlay is measured on a few wafers from the lot using a so-called overlay metrology tool, and the measured overlay metrology data is sent to the APC system. The APC system then calculates overlay corrections, based on exposure and processing history, and these corrections are used to adjust the scanner to minimize the overlay error. This is also known as an overlay metrology feedback loop.

However, because of the distortion of the TIS and/or overlay marks due to the lens aberrations remaining after compensation for the specific product application, significant X-Y alignment errors may still exist, and, if adjustments are done to minimize the errors on the TIS and/or overlay marks, these may be inappropriate to optimize the imaging performance during exposure of the product (or conversely to provide accurate alignment in the event that adjustments are done to minimize the product exposure errors).

Accordingly the IQEA model may be adapted to determine the appropriate corrections and permitted distortions for the different features (that is the product features, the TIS mask marks, the overlay metrology targets and the wafer alignment marks). Furthermore, since the different features are used at different points in the total lithographic control loop, it is important that the required error correction data is supplied to the right location.

In such an arrangement the IQEA model is disposed in a loop with a simulator to calculate the sensitivities of the different features. These sensitivities are input into the combined linearized IQEA-model/lens model that calculates the optimal lens settings for the product features. These lens settings are then sent to a lens driver for making the necessary lens adjustments. Furthermore, TIS mask (or reticle) mark offsets calculated by this model are sent to a metrology driver that is able to correct for these offsets so that the right mask alignment parameters will be calculated in an unbiased way. The TIS mark offsets are used to correct the measured TIS positions prior to exposure of the wafers in order to ensure that the positions of the product features are correctly represented. The offsets of the exposed overlay metrology targets and the non-zero wafer alignment marks provided by the model, which data needs to be used at a different time and location, are sent to the APC system. The metrology offsets are used to calculate the offset of the overlay metrology feedback and are accordingly supplied to the system that is going to expose the same layer. The wafer alignment mark offsets are supplied to the system that is going to expose the next layer in a feed forward arrangement.

In the case of a lens heating situation the data handling becomes more complex since all the corrections and offsets depend on the aberration drift of the system under the influence of the lens heating, and accordingly the shifts of all the different features (that is the product features, the TIS mask marks, overlay metrology targets and wafer alignment marks) due to such lens heating must be taken account of in the calculations. A typical sequence of calculations in this case for determining the X-Y positions of the product and the positions of the TIS, (off-line) overlay metrology and alignment features for each exposed die is as follows:

1. Just before exposure calculate the shifts in the X-Y positions of the TIS marks, the overlay metrology target and the alignment marks with respect to product position 2. Correct the measured TIS mark positions with the calculated offsets prior to exposure of the particular die on the wafer 3. Repeat for other dies and wafers, the lens heating causing the actual aberrations to change and the positions of the TIS marks, the overlay metrology target and the alignment marks to shift with respect to the product position 4. Store the shifts for overlay metrology target positions in the APC-system, so that the APC feedback loop can be optimised for product overlay (the overlay on some wafers being measured). It should be noted that, when the overlay metrology tool measures an overlay, this will always be a difference in the shifts for the two layers, and the shifts for both layers need to be taken account of in determination of the metrology overlay target. For example, in the case of a box-in-box-structure, it will be necessary to take into account a shift for the inner-box (this shift having been determined when exposing this inner-box, because it was exposed with image adjustments optimised for the product) and a different shift for the outer box (this shift also having been determined already) in order to get the best possible estimate of the true overlay.

5. When exposing the next layer on each wafer, correct the measured alignment mark positions with the calculated offsets before the exposure.

The invention claimed is:

1. A device manufacturing method using a lithographic projection apparatus, the method comprising:

illuminating a patterning device for a desired patterning application, with a beam of radiation to produce a patterned beam;

projecting the patterned beam onto a target portion to form an image thereon;

predicting changes in projection aberrations with time with respect to measured aberration values;

determining an application-specific effect of said predicted projection aberration changes on at least one parameter of the image;

generating a control signal specific to the desired patterning application according to said predicted projection system aberration changes and their application-specific effect; and adjusting the imaging based on the control signal.

2. The device manufacturing method according to claim 1, wherein the generating further comprises preferentially compensating predicted changes in features of the image in one of two directions in the plane of the image, in accordance with known sensitivities of the patterning device to projection system aberrations in the two directions.

3. The device manufacturing method according to claim 1, wherein the generating further comprises preferentially compensating changes in features of the image in a direction normal to the plane of the image, in accordance with known sensitivities of the patterning device to projection system aberrations in said direction.

4. The device manufacturing method according to claim 1, wherein the control signal further takes into account a defined merit function determining relative weightings to be given to selected effects of projection system aberrations on different parameters of the image.

5. The device manufacturing method according to claim 1, wherein said predicting is performed on the basis of a lens heating model that predicts changes in at least one aberration value with time as a result of lens heating or cooling.

6. The device manufacturing method according to claim 1, wherein the application-specific effect is determined on the basis of data indicative of the patterning device and an illumination mode used in the illuminating.

7. The device manufacturing method according to claim 1, wherein the generating is performed on the basis of known correspondence between changes in imaging adjustments and aberration changes being compensated for by such imaging adjustments.

8. The device manufacturing method according to claim 1, further comprising feeding back overlay metrology information to correct for a shift in a metrology overlay target for a current layer measured with respect to a metrology overlay target for a previous layer, as a result of said predicted changes and said adjusting, on the basis of an optimization procedure providing for changes in aberrations to which the image is most sensitive to be compensated for according to a defined merit-function.

9. The device manufacturing method according to claim 1, further comprising re-measuring at least one aberration value when the determined effect on the at least one parameter is greater than a corresponding threshold value.

10. The device manufacturing method according to claim 1, wherein the adjusting is carried out over successive scan positions during scanning exposure of the substrate to allow for variations in the scanned image over the extent of the substrate, in order to optimize the image as a function of scan position.

11. A machine readable medium encoded with machine executable instructions for performing a method, the method comprising:

predicting changes in projection aberrations with time with respect to measured aberration values for a desired patterning application on a lithographic projection apparatus;

determining an application-specific effect of said predicted projection aberration changes on at least one parameter of an image;

generating a control signal specific to the desired patterning application according to said predicted projection system aberration changes and their application-specific effect; and adjusting the imaging based on the control signal.

12. The machine readable medium according to claim 11, wherein the generating further comprises preferentially compensating predicted changes in features of the image in one of two directions in the plane of the image, in accordance with known sensitivities of the patterning device to projection system aberrations in the two directions.

13. The machine readable medium according to claim 11, wherein the generating further comprises preferentially compensating changes in features of the image in a direction normal to the plane of the image, in accordance with known sensitivities of the patterning device to projection system aberrations in said direction.

14. The machine readable medium according to claim 11, wherein the control signal further takes into account a defined merit function determining relative weightings to be given to selected effects of projection system aberrations on different parameters of the image.

15. The machine readable medium according to claim 11, wherein said predicting is performed on the basis of a lens heating model that predicts changes in at least one aberration value with time as a result of lens heating or cooling.

16. The machine readable medium according to claim 11, wherein the application-specific effect is determined on the basis of data indicative of the patterning device and an illumination mode used in the illuminating.

17. The machine readable medium according to claim 11, wherein the generating is performed on the basis of known correspondence between changes in imaging adjustments and aberration changes being compensated for by such imaging adjustments.

18. The machine readable medium according to claim 11, wherein the method further comprises feeding back overlay metrology information to correct for a shift in a metrology overlay target for a current layer measured with respect to a metrology overlay target for a previous layer, as a result of said predicted changes and said adjusting, on the basis of an optimization procedure providing for changes in aberrations to which the image is most sensitive to be compensated for according to a defined merit-function.

19. The machine readable medium according to claim 11, wherein the method further comprises re-measuring at least one aberration value when the determined effect on the at least one parameter is greater than a corresponding threshold value.

20. The machine readable medium according to claim 11, wherein the adjusting is carried out over successive scan positions during scanning exposure of the substrate to allow for variations in the scanned image over the extent of the substrate, in order to optimize the image as a function of scan position.

21. A method, comprising:
predicting changes in projection system aberrations with time with respect to measured aberration values;

determining an application-specific effect of the predicted projection system aberration changes on a parameter of an image of a pattern;

generating a control signal specific to the pattern according to the predicted projection system aberration changes and their application-specific effect on the parameter of the image; and based on the control signal, compensating for the application-specific effect of the predicted projection system aberration changes on the image.

22. The device manufacturing method according to claim 1, further comprising compensating for effects of a shift in a respective substrate alignment mark provided for the alignment of each layer of successive layers of images to be applied to the target portion of the substrate, the shift resulting from the predicted projection system aberration changes and adjusting the imaging, on the basis of an optimization procedure providing for the changes in aberrations to which the image is most sensitive to be compensated for according to a defined merit-function.

23. The device manufacturing method according to claim 1, further comprising compensating for effects of a shift in a respective patterning device alignment mark provided for the alignment of each layer of successive layers of images to be applied to the target portion, the shift resulting from the predicted projection system aberration changes and adjusting the imaging, on the basis of an optimization procedure providing for the changes in aberrations to which the image is most sensitive to be compensated for according to a defined merit-function.

* * * * *